(12) United States Patent
Hofstra

(10) Patent No.: US 7,796,414 B2
(45) Date of Patent: *Sep. 14, 2010

(54) MEMORY MODULE, SYSTEM AND METHOD OF MAKING SAME

(75) Inventor: Joseph Hofstra, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/346,227

(22) Filed: Dec. 30, 2008

(65) Prior Publication Data

US 2009/0103344 A1  Apr. 23, 2009

Related U.S. Application Data

(63) Continuation of application No. 11/394,262, filed on Mar. 30, 2006, now Pat. No. 7,471,538.

(51) Int. Cl.
*G11C 5/06* (2006.01)

(52) U.S. Cl. .............................. 365/63; 365/51; 365/52; 257/686

(58) Field of Classification Search .................. 365/51, 365/52, 63; 257/686
See application file for complete search history.

(56) References Cited

U.S. PATENT DOCUMENTS

| 6,754,117 | B2 | 6/2004 | Jeddeloh |
|---|---|---|---|
| 6,820,181 | B2 | 11/2004 | Jeddeloh et al. |
| 6,901,475 | B2 | 5/2005 | Porterfield |
| 6,979,895 | B2 | 12/2005 | Akram et al. |
| 6,982,892 | B2 | 1/2006 | Lee et al. |
| 6,993,612 | B2 | 1/2006 | Porterfield |
| 7,078,793 | B2 | 7/2006 | Ruckerbauer et al. |
| 2005/0086417 | A1 | 4/2005 | Meyer et al. |
| 2005/0138267 | A1 | 6/2005 | Bains et al. |
| 2005/0259504 | A1 | 11/2005 | Murtugh et al. |
| 2005/0273679 | A1 | 12/2005 | Bucksch |
| 2005/0278495 | A1 | 12/2005 | Lee |
| 2007/0189049 | A1 | 8/2007 | Djordjevic et al. |

OTHER PUBLICATIONS

US 6,944,743, 09/2005, Jeddeloh (withdrawn)

*Primary Examiner*—Van Thu Nguyen
(74) *Attorney, Agent, or Firm*—Traskbritt

(57) ABSTRACT

A memory module, system and method of making the same includes a memory module including a plurality of memory devices having a first portion of memory devices cooperatively forming a first rank of memory devices and a second portion of memory devices cooperatively forming a second rank of memory devices. The first and second portions of memory devices are grouped into a plurality of memory device stacks, wherein each of the plurality of memory device stacks includes at least one of the plurality of memory devices coupled to a first portion of a plurality of DQ signals and at least another one of the plurality of memory devices coupled to a different second portion of the plurality of DQ signals.

17 Claims, 6 Drawing Sheets

MEMORY MODULE, SYSTEM AND METHOD OF MAKING SAME

CROSS-REFERENCE TO RELATED APPLICATION

This application is a continuation of application Ser. No. 11/394,262 filed Mar. 30, 2006, now U.S. Pat. No. 7,471,538, issued Dec. 30, 2008. The disclosure of the previously referenced U.S. patent application is hereby incorporated by reference in its entirety.

BACKGROUND OF THE INVENTION

1. Field of the Invention

This invention relates generally to memory modules and, more particularly, to a structure and method for arranging and interconnecting memory devices on a buffered memory module.

2. State of the Art

Computer systems use memory devices such as dynamic random access memory (DRAM) devices to store instructions and data for access and processing by a system processor. Such memory devices are conventionally used as system memory where a processor communicates with the system memory through a processor bus and a memory controller. In such an architecture, the processor issues a memory request in the form of a memory command, such as a read or write command, and an address designating the location from or to which the data is to be read or written. Accordingly, the memory controller uses the command and address to generate appropriate row and column addresses to the system memory. In response thereto, the data is transferred between the system memory and the processor.

While the operating speed of memory devices has continuously increased, the speed of memory devices has not kept pace with the speed of the information-requesting processors. Accordingly, the relatively slow speed of memory devices limits the data bandwidth between the processor and the memory devices. Additionally, the performance of computer systems is also limited by latency associated with reading data from memory devices in a computer system. Specifically, when a memory device read command is sent to a system memory device, such as a synchronous DRAM (SDRAM) device, the data as read from the memory device is output only after a delay of several clock cycles. While SDRAM memory devices may output data at a high data rate in a burst mode, for example, the delay in initially providing the data can significantly slow the operating speed of the computer system.

One method for alleviating the memory latency problem is to utilize multiple memory devices coupled to the processor through a memory hub. In a memory hub architecture, a system or memory controller is coupled to multiple memory modules, each of which includes a controller such as a memory hub coupled to one or more memory devices. A computer system configured in a memory hub architecture more efficiently routes memory requests and responses between the controller and the memory devices resulting in a higher bandwidth since a processor can access a first memory device while a second memory device is responding to a prior memory access request.

FIG. 1 illustrates a conventional memory system 100 configured in accordance to a memory hub architecture. As illustrated, a host 102 is coupled to a plurality of memory modules 104 which are illustrated as being connected in a "daisy chain" connection architecture. In such an architecture, the plurality of memory modules 104 is serially connected by a bus 110. Accordingly, signals or commands from the host 102 or memory controller are transferred in order to each adjacent memory module of the plurality of memory modules 104.

Each of the plurality of memory modules 104 are illustrated as including a hub 106 and a plurality of memory devices collectively illustrated as memory devices 108. The plurality of memory modules 104 may be configured as single in-line memory modules (SIMMs) or dual in-line memory modules (DIMMs). Those of ordinary skill in the art appreciate that SIMMs have memory devices on one side of the memory module whereas DIMMs have memory devices on both sides of the memory module. Furthermore, DIMMs may be further configured as registered DIMMs (R-DIMMs) or fully-buffered DIMMs (FB-DIMMs).

In an R-DIMM, signals except data signals are transferred from a memory controller to the memory devices by way of one or more registers. In an FB-DIMM, all signals from a memory controller are passed to the memory devices through a hub or advanced memory buffer (AMB), which is typically disposed on one side of the memory module. The hub or AMB is responsible for communicating with the edge connector and generating and receiving all signals to and from the memory devices. An AMB is also responsible for generating the correct timing of signals to and from the memory devices and, by way of example, AMBs are designed as generic devices that may operate at data rates from around 3.2 Gb/s to 4.8 Gb/s and support a plurality of memory devices.

On a memory module, memory devices may be partitioned or grouped into sets of memory devices commonly known as ranks. A single rank memory module includes a set of memory devices on a module generally comprising eight bytes or sixty-four bits of data and/or one byte or eight bits of error correction coding bits. All memory devices in a single rank are simultaneously selected or activated by a single chip select (CS) signal. Generally, SIMMs are single-rank modules.

Similarly, double-sided DIMMs are generally dual or two-rank memory modules. Dual-rank memory modules are configured such that each rank is connected by a single chip select (CS) signal. Generally, DIMMs are configured to include a single rank of memory devices on each side of the memory module. Furthermore, each rank comprises the quantity of memory devices with sufficient DQ signals to correspond with the bus width of the hub on the memory module. Accordingly, since a conventional bus width is generally sixty-four bits plus eight bits of error correction coding, sixteen separate memory devices or eighteen separate memory devices when error correction coding is included are required to form a single rank when each memory device includes a four bit data or DQ signal width, also known as a "by-four" memory device.

Accordingly, for a two or dual-rank DIMM, thirty-two memory devices or thirty-six memory devices when error correction coding is utilized are needed to populate a DIMM when "by-four" memory devices are utilized. Since DIMMs are utilized in a myriad of computer systems and their dimensions are regulated or standardized, the placement of such a vast number of memory devices on a memory module substrate becomes a significant design challenge. Accordingly, there is a need to provide an architecture which enables an effective placement and interconnection of a large number of memory devices on a memory module.

BRIEF SUMMARY OF THE INVENTION

A memory module, system and method of making the same includes memory devices having a plurality of stacks of memory devices for forming a plurality of ranks of memory devices. In one embodiment of the present invention, a memory module includes an interconnection board having a first side and a second side with the first side including a hub location and the second side including an unpopulated location opposite the hub location. The first and second sides further include a plurality of memory device stack locations exclusive to the hub and unpopulated locations. The memory module further includes a hub and a plurality of memory devices. The hub is operatively coupled to the interconnection board at the hub location of the interconnection board and the hub is configured to support a plurality of DQ signals on the memory module. The plurality of memory devices includes a first portion of memory devices cooperatively forming a first rank of memory devices and a second portion of memory devices cooperatively forming a second rank of memory devices with the first and second portions of memory devices grouped into a plurality of memory device stacks and operatively coupled to the interconnection board at the plurality of memory device stack locations.

In another embodiment of the present invention, a memory module includes a plurality of memory devices including a first portion of memory devices cooperatively forming a first rank of memory devices and a second portion of memory devices cooperatively forming a second rank of memory devices. The first and second portions of memory devices are grouped into a plurality of memory device stacks, wherein each of the plurality of memory stacks includes at least one of the plurality of memory devices coupled to a first portion of the plurality of DQ signals and at least another one of the plurality of memory devices coupled to a different second portion of the plurality of DQ signals.

In a further embodiment of the present invention, a computer system includes a processor, a memory hub controller coupled to the processor and a memory system coupled to the memory hub controller via the high-speed memory interface. The memory system includes at least one memory module comprising a plurality of memory devices including a first portion of memory devices cooperatively forming a first rank of memory devices and a second portion of memory devices cooperatively forming a second rank of memory devices. The first and second portions of memory devices are grouped into a plurality of memory device stacks, wherein each of the plurality of memory device stacks includes at least one of the plurality of memory devices coupled to a first portion of the plurality of DQ signals and at least another one of the plurality of memory devices coupled to a different second portion of the plurality of DQ signals.

In yet another embodiment of the present invention, a method of forming a memory on a memory module is provided. The method includes forming an interconnection board having a first side and a second side with the first side including a hub location and the second side including an unpopulated location opposite the hub location. An interconnection board is populated with a plurality of memory devices on the first and second sides at a plurality of memory device stack locations exclusive to the hub and unpopulated locations. The interconnection board is further populated with a hub at the hub location of the interconnection board with the hub configured to support a plurality of DQ signals on the memory module. The plurality of memory devices is operatively interconnected including a first portion of memory devices cooperatively forming a first rank of memory devices and a second portion of memory devices cooperatively forming a second rank of memory devices. The first and second portions of memory devices are grouped into a plurality of memory device stacks wherein each of the plurality of memory device stacks includes at least one of the plurality of memory devices coupled to a first portion of the plurality of DQ signals and at least another one of the plurality of memory devices coupled to a different second portion of the plurality of DQ signals.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
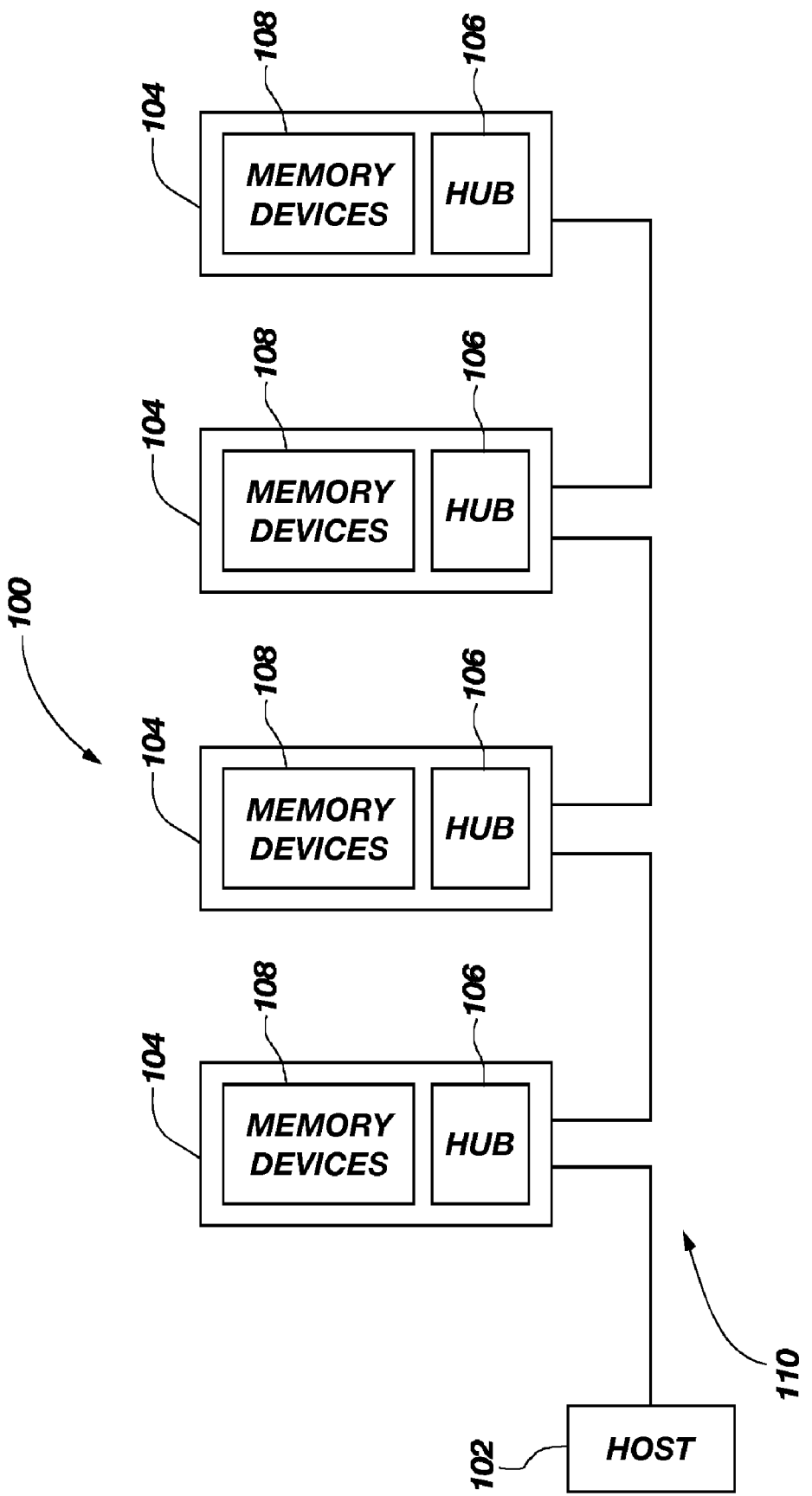
FIG. 1 is a block diagram of a portion of a computer memory system.
Figure 2:
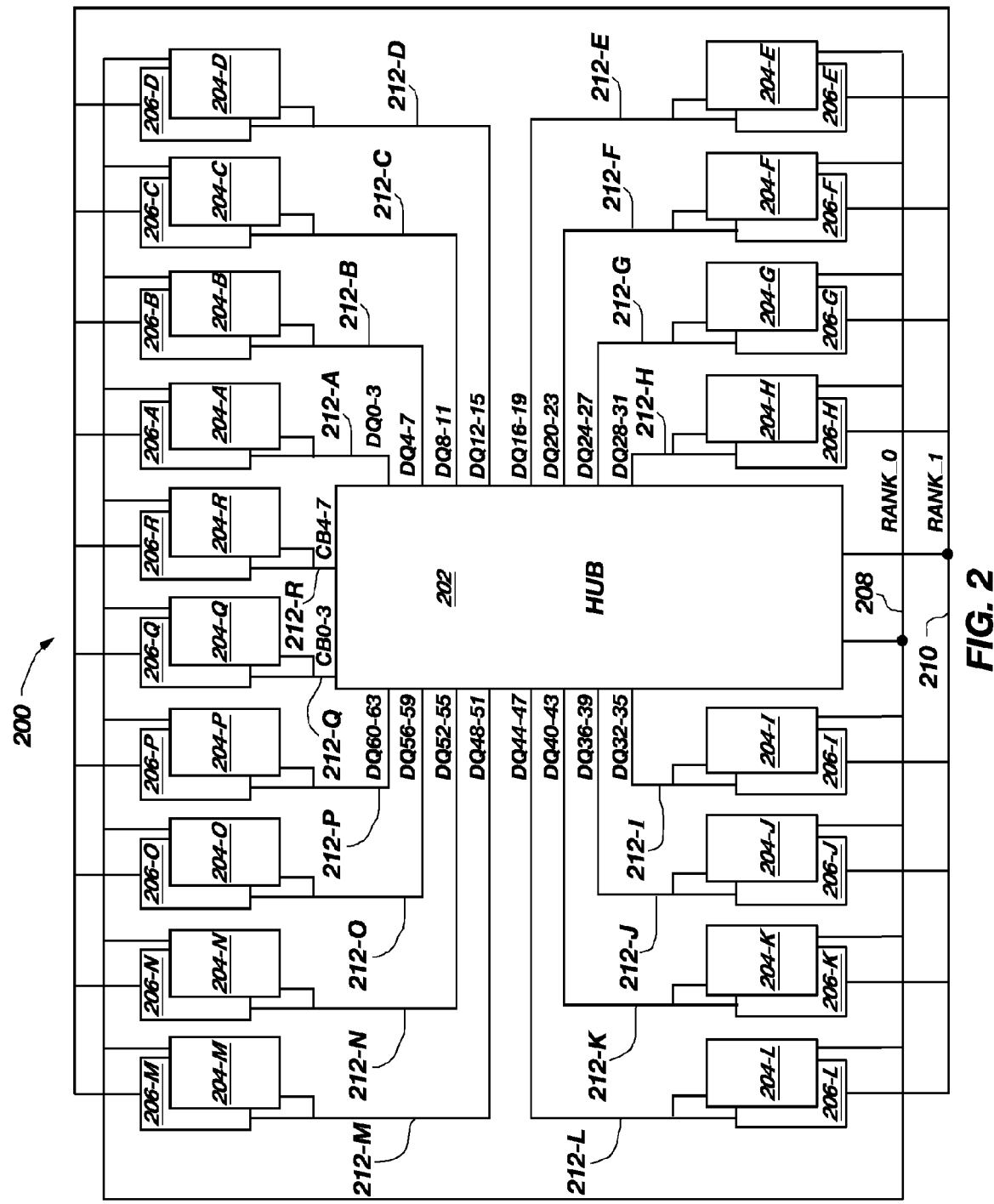
FIG. 2 is block diagram of a dual-rank memory module, in accordance with an embodiment of the present invention.

FIG. 2 is a block diagram of a dual-rank, fully-buffered memory module, in accordance with an embodiment of the present invention. DIMM 200 includes "hub" 202 including an interface (not shown) for coupling with module bus 110 (FIG. 1). As used herein, the term "hub" refers to commonly known on-module controllers that have conventionally become known by that term. Additionally, the term "hub" as used herein further includes other on-module controllers such as an advanced memory buffer (AMB). For brevity, all such on-module controllers will be collectively referred to herein as "hubs."

In FIG. 2, DIMM 200 is configured as a dual-rank DIMM which includes a chip select signal 208 for selecting a first or rank__0 of memory devices 204 and further includes a chip select signal 210 for selecting a second or rank__1 of memory devices 206. Memory devices 204 and memory devices 206 are commonly respectively coupled to input/output (I/O) or DQ signals 212. Thus, bus contention associated with multiple devices coupling to common DQ signals 212 are resolved by assertion of the chip select signals 208, 210.

By way of example and not limitation, the memory devices 204, 206 are configured as "by-four" devices which specify the number of I/O or DQ signals per device. As stated, each individual rank of memory devices is comprised of a quantity of memory chips required to generate a quantity of I/O signals which are supported by hub 202. In the present embodiment, by way of example and not limitation, hub 202 is configured to include a seventy-two bit wide bus. Accordingly, each rank supports sixteen "by-four" devices (64 bits), plus an additional two "by-four" memory devices (8 bits) of error correction bits. Accordingly, each rank using "by-four" memory devices requires eighteen individual memory devices.

Figure 3:
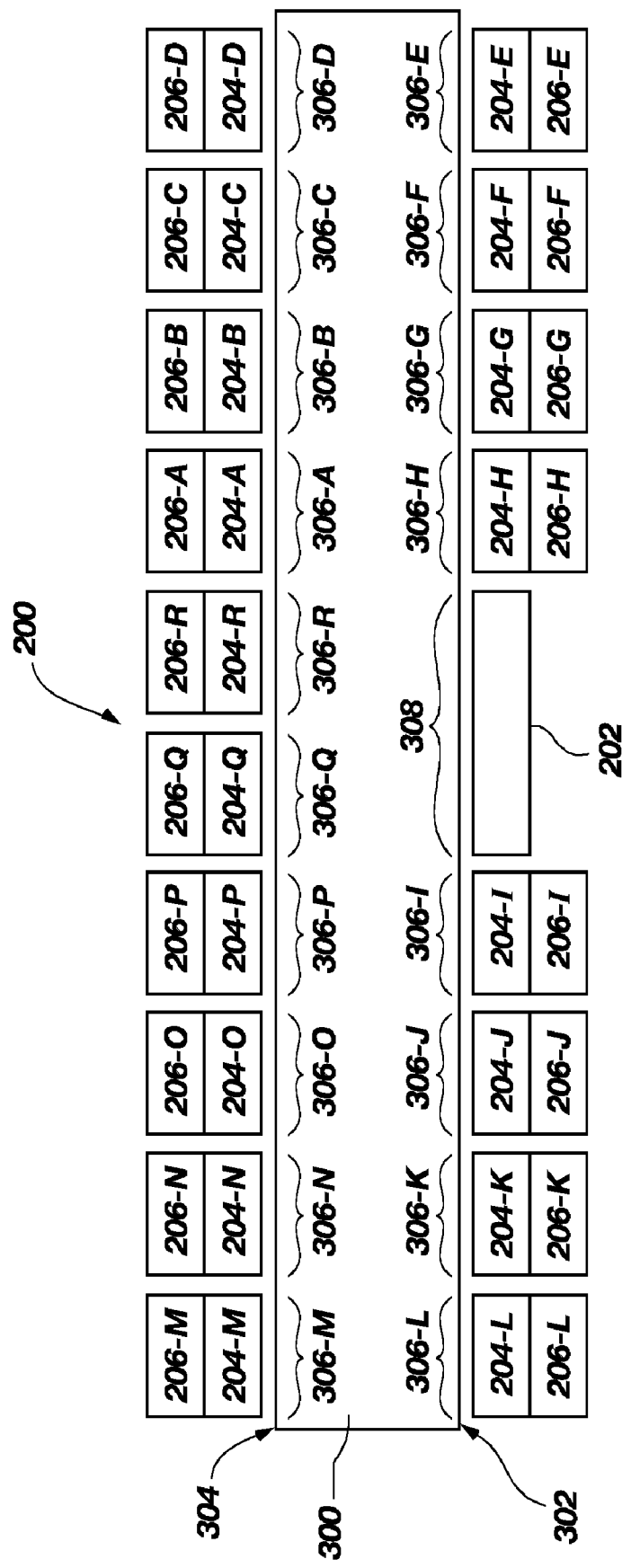
FIG. 3 is a cross-sectional diagram of a dual-rank memory module, in accordance with an embodiment of the present invention.

FIG. 3 is a cross-sectional view of a dual-rank fully-buffered DIMM, in accordance with an embodiment of the present invention. As stated, a "by-four"-based DIMM with two ranks of memory devices requires eighteen memory devices per rank. Accordingly, FIG. 3 illustrates a "by-four"-based DIMM with two ranks wherein memory devices are arranged in a "stack" with each stack of memory devices including two "by-four" memory devices at each memory device stack location on the memory module. DIMM 200 includes a hub 202 which generally is implemented as a single device. Accordingly, hub 202 is populated on a first or lower side 302 of interconnection board 300.

In the present configuration, rank_0 is defined as the lower eighteen memory devices coupled directly to the memory module interconnection board 300 while the second or rank_1 memory devices are stacked or coupled to an opposing side of the rank_0 memory devices. As stated, a rank of memory devices is comprised of a quantity of memory devices resulting in the quantity of DQ signals which are supported by the hub 202. By way of example and not limitation, the bus width in the present illustration includes a bus width of sixty-four bits of data with an additional eight bits of error correction coding bits totaling seventy-two bits. Accordingly, such an architecture requires sixteen "by-four" memory devices to implement the sixty-four data bits and two additional "by-four" memory devices to implement the eight bits of error correction code for each rank of memory devices on the memory module.

Accordingly, a first or rank_0 arrangement of memory devices 204 is correspondingly located at locations 306 along the first surface 302 and the second surface 304 of interconnection board 300. It is noted that hub 202 is centrally located on a first side 302 of interconnection board 300 at a hub location 308. Due to the physical surface area constraints of DIMM 200, the majority of surface areas of interconnection board 300 are occupied by hub 202 and first rank memory devices 204. Accordingly, a second or rank_1 grouping of memory devices 206 is stacked on top of the first rank or rank_0 of memory devices 204.

As previously stated, hub 202 operates at high data rates which in turn generates a significant amount of heat. In an alternate embodiment of the present invention, locations 306-Q, 306-R opposing hub location 308 for housing hub 202 may remain unpopulated due to any significant heat potentially generated by hub 202 radiating to the opposing or second side 304 of interconnection board 300.

Figure 4:
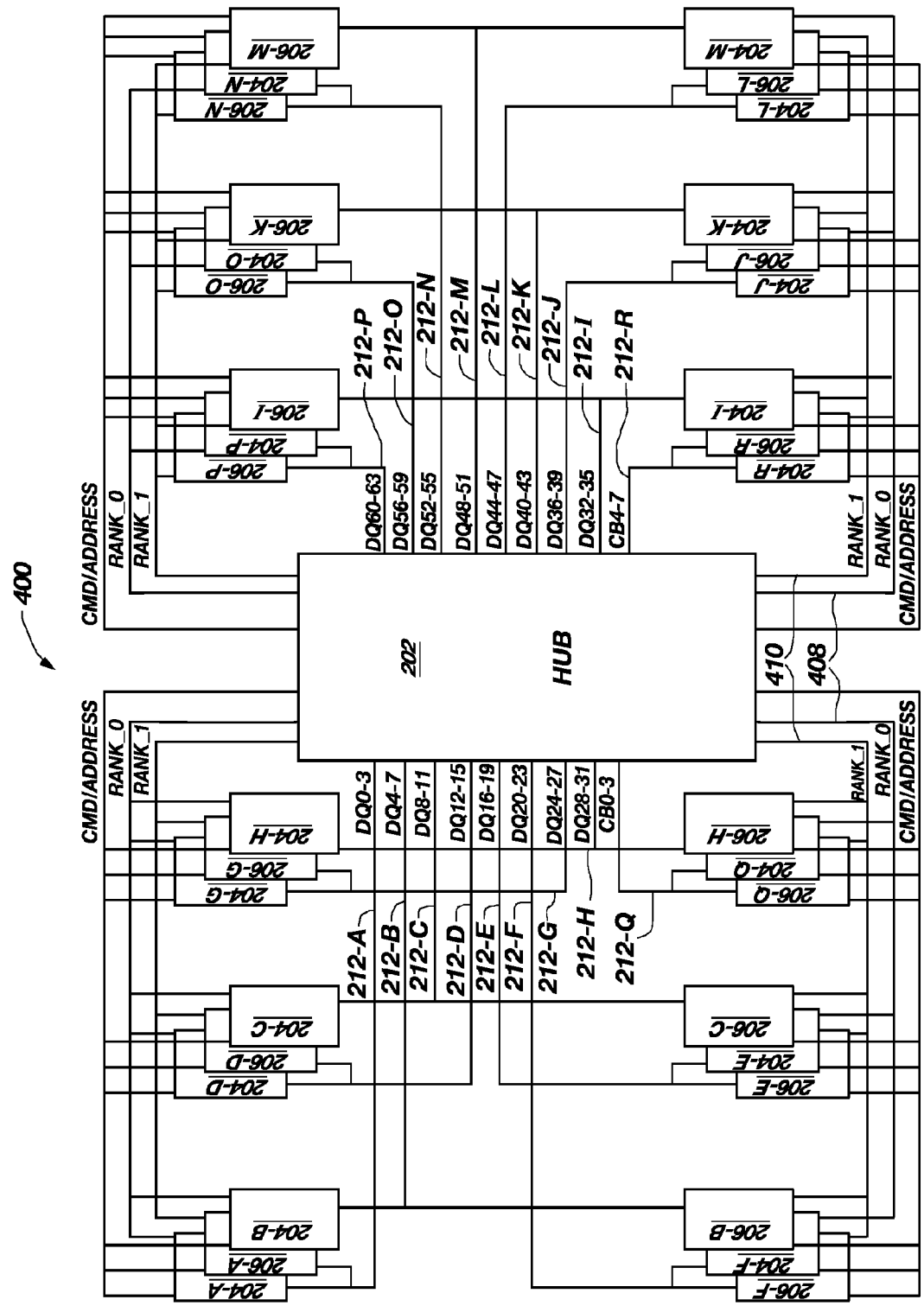
FIG. 4 is a block diagram of a dual-rank memory module, in accordance with another embodiment of the present invention.

Accordingly, FIG. 4 is a block diagram of a dual-rank fully-buffered DIMM, in accordance with another embodiment of the present invention. As stated, a "by-four"-based DIMM with two ranks of memory devices requires eight memory devices per rank. DIMM 400 includes a hub 202 including an interface (not shown) for coupling with module bus 110 (FIG. 1). DIMM 400 is configured as a dual-rank fully-buffered DIMM which includes a chip select (CS) signal 408 for selecting a first rank or rank_0 of memory devices 204 and further includes a chip select (CS) signal 410 for selecting a second or rank_1 of memory devices 206. Memory devices 204 and memory devices 206 are commonly respectively coupled to I/O signals such as DQ signals 212. Bus contention associated with multiple devices coupling to common DQ signals 212 are resolved by the selection and assertion of chip select signals 408, 410.

By way of example and not limitation, the memory devices 204, 206 are configured as "by-four" devices which specify the number of DQ signals per device. As stated, each individual rank of memory devices is comprised of a quantity of memory devices resulting in the quantity of DQ signals which are supported by the hub 202. In the present embodiment and by way of example and not limitation, hub 202 is configured to include a seventy-two bit wide bus. Accordingly, each rank supports sixteen "by-four" devices (64 bits), plus an additional two "by-four" memory devices (8 bits) of error correction bits. Accordingly, each rank using "by-four" memory devices requires eighteen specific memory devices.

As stated, it is known that a hub or advanced memory buffer (AMB) operates at a significant speed and therefore generates a correspondingly significant amount of heat. Furthermore, the generated heat is concentrated and transferred through an interconnection board to an unpopulated location opposite of hub location 308 (FIG. 3). Therefore, devices placed at locations on a surface opposite of the hub location 308 would be subjected to operating temperatures that may exceed memory device specifications. Accordingly, an architecture as illustrated with respect to FIGS. 4 and 5 does not require placement of memory devices in a corresponding location on a surface opposite of hub location 308.

Figure 5:
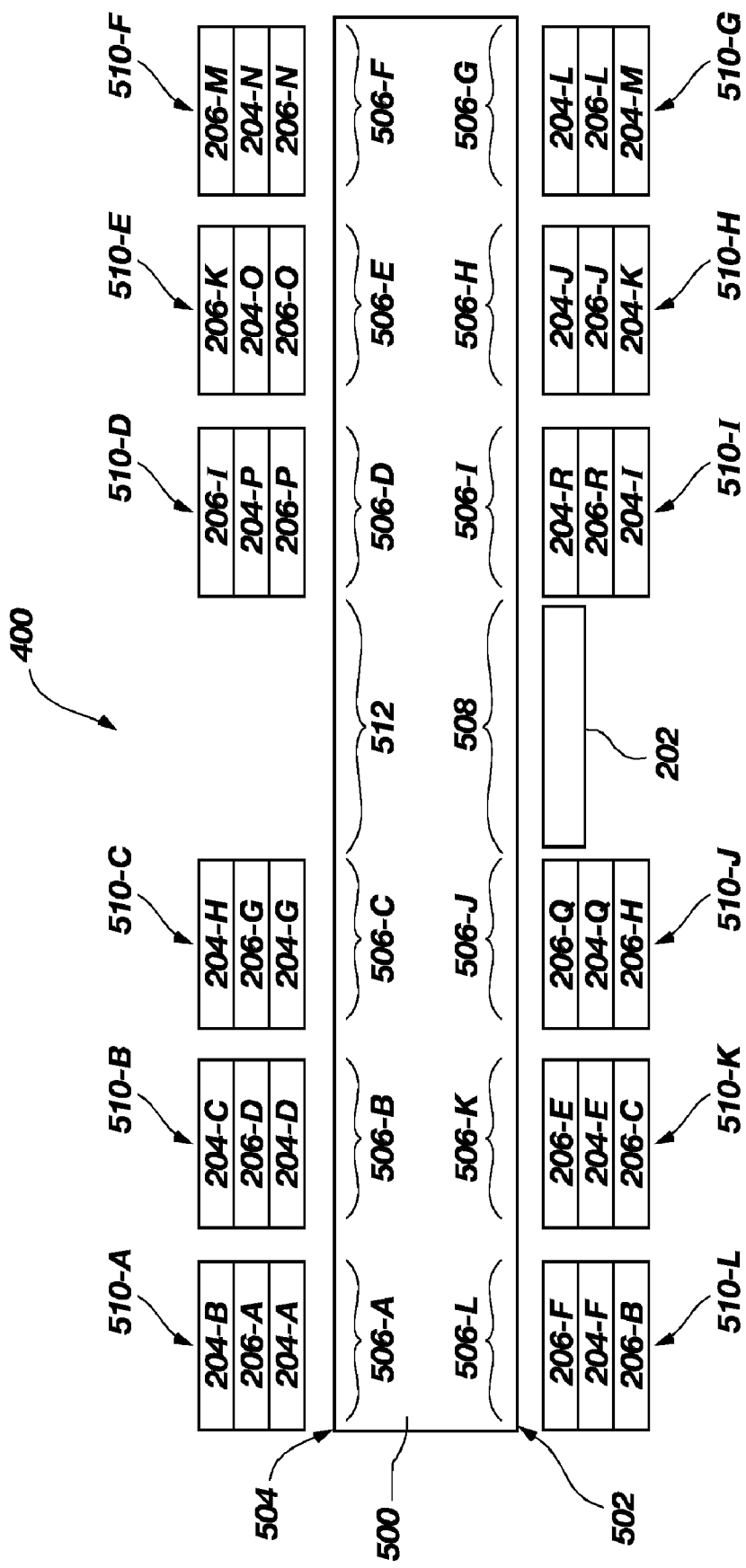
FIG. 5 is a cross-sectional diagram of a dual-rank memory module, in accordance with another embodiment of the present invention.

FIG. 5 is a cross-sectional view of a dual-rank fully-buffered memory module, in accordance with another embodiment of the present invention. DIMM 400 includes a hub 202 which generally is implemented as a single device and is located on a first surface 502 of interconnection board 500 at a hub location 508. It is appreciated by those of ordinary skill in the art that due to the high data rate nature of hub 202, hub 202 may consume a significant amount of power resulting in the generation of a not insignificant amount of heat. Since the operational temperature rating of memory devices is generally much lower than the temperature rating of hub 202, operation of memory devices when located on an opposing unpopulated location 512 to hub location 508 may contribute to data errors and affect the reliability of DIMM 400. Accordingly, a significant portion of the heat generated by hub 202 transfers through interconnection board 500 to an unpopulated location 512 on an opposing or second surface 504 of interconnection board 500.

Continuing with respect to FIG. 5, hub 202 is populated on a first or lower surface 502 of interconnection board 500. In the present embodiment, hub 202 is placed on a first surface 502 of interconnection board 500 at a hub location 508. Opposite hub location 508 on a second surface 504 of interconnection board 500 is an unpopulated location 512 identifying a "keep out" region for memory devices due to elevated operating temperature conditions or otherwise. Additionally, hub 202 is configured to provide an interface between a host or memory controller and the plurality of memory devices on DIMM 400.

As stated, a rank of memory devices comprises a quantity of memory devices with sufficient DQ signals to correspond with the bus width of the hub 202. By way of example and not limitation, the bus width in the present illustration includes a bus width of sixty-four bits of data with an additional eight bits of error correction coding bits. Accordingly, such an architecture requires sixteen "by-four" memory devices to implement the sixty-four data bits, and two additional "by-four" memory devices to implement the eight bits of error correction coding for each rank of memory on the module. DIMM 400 further includes a plurality of memory devices 204, 206 populated on a first surface 502 and a second surface 504 of interconnection board 500.

With reference to FIGS. 4 and 5, DIMM 400 finds placement locations for memory devices which are subjected to more hospitable operating conditions. Therefore, memory devices 204, 206 are placed at memory device stack locations 506 which are exclusive to unpopulated location 512 generally located on an opposing surface to hub location 508. In order to provide an adequate quantity of memory devices to satisfy rank requirements, the present embodiment comprises a quantity of memory devices with sufficient DQ signals to correspond with the bus width of the hub 202. By way of example and not limitation, the bus width in the present illustration includes a bus width of sixty-four bits of data with an additional eight bits of error correction coding bits. Accordingly, such an architecture requires sixteen "by-four" memory devices to implement the sixty-four data bits, and two additional "by-four" memory devices to implement the eight bits of error correction coding for each rank of memory on the DIMM 400. Accordingly, a first or rank_0 arrangement of memory devices 204 and a second or rank_1 arrangement of memory devices 206 requires a total of thirty-six "by-four" memory devices 204, 206.

In order to accommodate thirty-six separate "by-four" memory devices in an area exclusive of unpopulated location 512, the present embodiment utilizes a stacking configuration which includes a first stack including at least one memory device whose respectively corresponding shared memory device's DQ signals are coupled to a memory device located in a different stack. Specifically, a plurality of memory device stacks 510 are correspondingly located at a plurality of memory device stack locations 506 with each memory device stack 510 including at least one memory device whose respectively corresponding different-rank memory device is located in a separate stack of memory devices. For example, memory device stack 510-A includes memory devices 204-A, 206-A, 204-B. Memory device 204-A corresponds to DQ signals 212-A (FIG. 4) and is activated by a chip select 408 for enabling a first rank or rank_0 grouping of memory devices. Similarly, memory device 206-A is also coupled to DQ signals 212-A (FIG. 4) which is activated by a chip select 410 which is used for the activation of a second or rank_1 grouping of memory devices. Also located within memory device stack 510-A is memory device 204-B which is not coupled to DQ signals 212-A but rather is coupled to DQ signals 212-B (FIG. 4) and is activated by a chip select 408 corresponding to the activation of a first or rank_0 grouping of memory devices.

It should be noted that with reference to FIG. 5, the specific assignments and locations of stacks and memory devices within the various stacks are illustrative and not to be considered to be limiting. For example, placement of memory devices within specific memory device stacks and the memory device stack location of specific stacks with reference to the hub 202 device for the optimization of impedance loading of the various DQ signals 212 (FIG. 4) is contemplated and is considered to be within the scope of the present invention.

Additionally, the present illustration is with reference to "by-four" memory devices and also with reference to dual rank memory modules. However, the utilization of "by-integer" (e.g., "by-two," "by-six," "by-eight," etc.) is also contemplated as within the scope of the present invention. Furthermore, the present invention further contemplates an extension of the present inventive embodiments to include memory modules including a rank quantity in excess of two (e.g., four-rank memory module, six-rank memory module, eight-rank memory module, etc.).

Figure 6:
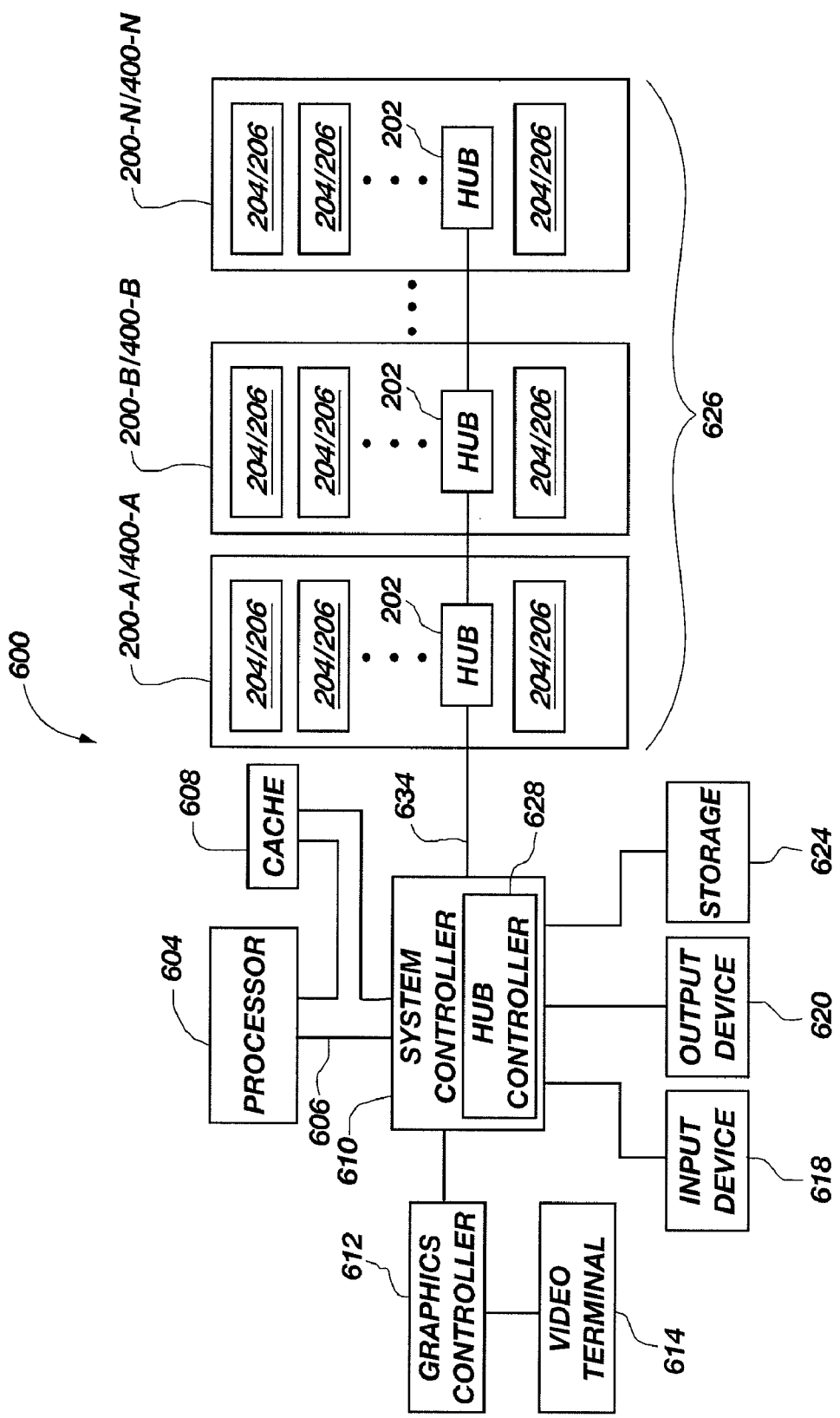
FIG. 6 is a block diagram of a computer system, in accordance with a further embodiment of the present invention.

FIG. 6 is a computer system including a memory system further including one or more memory modules, in accordance with an embodiment of the present invention. A computer system 600 includes a processor 604 for performing various computing functions, such as executing specific software to perform specific calculations or tasks. Processor 604 includes a processor bus 606 which conventionally includes an address bus, a control bus and a data bus. Processor bus 606 is typically coupled to a cache memory 608 which may take the form of static random access memory (SRAM). Furthermore, processor bus 606 may be coupled to a system controller 610, which is also sometimes referred to as a "north bridge" or "memory controller."

The system controller 610 serves as a communication path to the processor 604 for a variety of other components. More specifically, the system controller 610 may include a graphics port that is typically coupled to graphics controller 612 which may be further coupled to a video terminal 614. The system controller 610 may also couple to one or more input devices 618, such as a keyboard or mouse, to allow an operator to interface with the computer system 600. Typically, the computer system 600 may also include one or more output devices 620, such as a printer, coupled to processor 604 through the system controller 610. One or more data storage devices 624 are also typically coupled to the processor 604 through the system controller 610 to allow the processor 604 to store data or retrieve data from internal or external storage media (not shown). Examples of typical storage devices 624 include disc drives, CD drives, flash drives, as well as other storage devices known by those with ordinary skill in the art.

The system controller 610 may further include a memory hub controller 628 that is coupled to a memory system 626 which may include one or more memory modules 200-A-200-N, 400-A-400-N, which serves as system memory for the computer system 600. The memory modules 200, 400 are preferably coupled to the memory hub controller 628 through a high speed link 634.

The memory modules 200, 400 are shown coupled to the memory hub controller 628 in a multi-drop arrangement in which the single high speed link 634 is coupled to all of the memory modules 200, 400. However, it is also understood that other topologies may be used such as a point-to-point coupling arrangement in which a separate high speed link is used to couple each of the memory modules 200, 400 to the memory hub controller 628. Each of the memory modules 200, 400 includes a memory hub 202 for controlling access to the various memory devices 204, 206 which are arranged in a plurality of ranks as described herein above with respect to FIGS. 2-5.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description.

What is claimed is:

1. A memory module, comprising:
a first portion of memory devices cooperatively forming a first rank of memory devices; and
a second portion of memory devices cooperatively forming a second rank of memory devices, the first and second portions of memory devices grouped into a plurality of memory device stacks, wherein each of the plurality of memory device stacks includes at least one of the plurality of memory devices coupled to a first portion of a plurality of DQ signals and at least another one of the plurality of memory devices coupled to a different, second portion of the plurality of DQ signals.

2. The memory module of claim 1, wherein the first rank of memory devices and the second rank of memory devices each includes at least one memory device configured for storing error correction codes.

3. The memory module of claim 1, wherein each of the plurality of memory devices is configured to include four DQ signals.

4. The memory module of claim 1, wherein each rank of the memory module includes nine memory devices.

5. The memory module of claim 1, wherein the memory module conforms to size dimensions of a dual in-line memory module (DIMM).

6. The memory module of claim 1, wherein at least one of the plurality of memory device stacks includes three memory devices.

7. A memory module, comprising a first rank of memory devices and a second rank of memory devices, the memory devices grouped into a plurality of memory device stacks, wherein each of the plurality of memory device stacks includes at least one of the plurality of memory devices coupled to a first portion of a plurality of DQ signals and at least another one of the plurality of memory devices coupled to a different, second portion of the plurality of DQ signals.

8. A computer system, comprising:

a processor;

a memory hub controller coupled to the processor and further including a high-speed memory interface; and a memory system coupled to the memory hub controller via the high-speed memory interface, the memory system including a first rank of memory devices and a second rank of memory devices, the first rank of memory devices and the second rank of memory devices grouped into a plurality of memory device stacks, wherein each of the plurality of memory device stacks includes at least one of the plurality of memory devices coupled to a first portion of a plurality of DQ signals and at least another one of the plurality of memory devices coupled to a different, second portion of the plurality of DQ signals.

9. The computer system of claim 8, further comprising:

an interconnection board having a first side and a second side, the first side including a hub location and the second side including an unpopulated location opposite the hub location, the first and second sides further including a plurality of memory device stack locations exclusive to the hub location and the unpopulated location; and a hub operatively coupled to the interconnection board at the hub location of the interconnection board, the hub configured to support a plurality of DQ signals on at least one memory module.

10. The computer system of claim 9, wherein the first rank of memory devices and the second rank of memory devices each includes at least one memory device configured for storing error correction codes.

11. The computer system of claim 9, wherein the hub is configured to support sixty-four data DQ signals on the at least one memory module.

12. The computer system of claim 11, wherein the hub is further configured to support sixty-four data DQ signals and eight error correction coding DQ signals on the at least one memory module.

13. The computer system of claim 9, wherein each of the plurality of memory devices is configured to include four DQ signals.

14. The computer system of claim 9, wherein each rank of the at least one memory module includes nine memory devices.

15. The computer system of claim 9, wherein the at least one memory module conforms to size dimensions of a dual in-line memory module (DIMM).

16. The computer system of claim 9, wherein at least one of the plurality of memory device stacks includes three memory devices.

17. A method of forming a memory on a memory module, comprising:

populating an interconnection board with a plurality of memory devices on first and second sides of the interconnection board at a plurality of memory device stack locations and with a hub configured to support a plurality of DQ signals on the memory module; and operatively interconnecting the plurality of memory devices including a first portion of memory devices cooperatively forming a first rank of memory devices and a second portion of memory devices cooperatively forming a second rank of memory devices, the first and second portions of memory devices grouped into a plurality of memory device stacks, wherein each of the plurality of memory device stacks includes at least one of the plurality of memory devices coupled to a first portion of the plurality of DQ signals and at least another one of the plurality of memory devices coupled to a different second portion of the plurality of DQ signals.

* * * * *